United States Patent
Adachi

(10) Patent No.: US 6,676,487 B1
(45) Date of Patent: Jan. 13, 2004

(54) METHOD FOR POLISHING SURFACE OF VAPOR-PHASE SYNTHESIZED THIN DIAMOND FILM

(75) Inventor: Miki Adachi, Omiya (JP)

(73) Assignee: Mitsubishi Materials Corporation, Tokyo (JP)

( * ) Notice: Subject to any disclaimer, the term of this patent is extended or adjusted under 35 U.S.C. 154(b) by 280 days.

(21) Appl. No.: 09/192,564

(22) Filed: Nov. 17, 1998

(30) Foreign Application Priority Data

Nov. 17, 1997 (JP) .............................................. 9-314925

(51) Int. Cl.$^7$ ................................................. B24R 1/00
(52) U.S. Cl. ........................... 451/41; 451/59; 438/692; 156/345.12
(58) Field of Search .............................. 451/41, 54, 59, 451/63, 285, 287; 428/231; 438/692, 693; 156/345.11, 345.12

(56) References Cited

U.S. PATENT DOCUMENTS 5,472,370 A  * 12/1995  Malshe et al. ................ 451/54

* cited by examiner

Primary Examiner—Joseph J. Hail, III
(74) Attorney, Agent, or Firm—Oblon, Spivak, McClelland, Maier & Neustadt, P.C.

(57) ABSTRACT

A surface of a vapor-phase deposited, synthetic thin diamond film is polished by:

preparing a polishing liquid of silicon dioxide powder particles having an average particle size within the range of from 5 to 1,000 nm dispersed and distributed in an aqueous solution in an amount of from 5 to 40 wt. %, the dispersion having a coefficient of viscosity of from 1 to 200 cP and a pH of from 8 to 12.5, applying the polishing liquid to a surface of a vapor-phase synthetic thin diamond film and bringing a flat surface of a stool composed of a soft artificial or natural organic material into contact with the surface; and repetitively applying a mutual planar movement under pressure between the surface of said stool and the surface of the thin diamond film.

18 Claims, No Drawings

//  METHOD FOR POLISHING SURFACE OF VAPOR-PHASE SYNTHESIZED THIN DIAMOND FILM

BACKGROUND OF THE INVENTION

1. Field of the Invention

The present invention relates to a method for forming a polished surface of excellent smoothness on the surface of a vapor-phase synthesized thin diamond film (hereinafter referred to as a "thin diamond film").

2. Description of the Background

It is well-known that an X-ray mask deposited on a semiconductor surface for the preparation of an integrated circuit on the semiconductor can be prepared by:

(a) forming a thin diamond film having an excellent X-ray transmissivity of a thickness of from 1 to 3 $\mu$m by the known vapor-phase synthesis technique on the upper surface of an Si wafer (substrate) having a thickness of about 380 $\mu$m;

(b) polishing the surface of the thus formed thin diamond film to a prescribed surface roughness; then (c) forming a membrane composed of the thin diamond film by melting and removing the center portion of the Si wafer from the backside thereof by the use of an etching solution such as a mixture of hydrofluoric acid and nitric acid, thereby forming an Si frame;

(d) sequentially forming an undercoat film, comprising indium-tin oxide, for example, having a high permeability to visible light while preventing the build-up of electric charge caused by charged particles, an X-ray absorber of W—Ti alloy (containing from 1 to 2% Ti), a metallic Cr film serving as an etching mask, and a resist film on the membrane applied by sputtering or spin coating;

(e) forming a pattern of an integrated semiconductor circuit by scanning the resist film with an electron beam;

(f) etching the metallic Cr film by exposure to a mixed gas of chlorine and oxygen, using the thus formed pattern as an etching mask; then (g) in a state in which the Si frame is cooled to about −50° C., low-temperature etching the X-ray absorber from the bottom thereof, thereby forming an integrated circuit pattern on the semiconductor; and (h) finally removing the metallic Cr film.

For the purpose of polishing the surface of the thin diamond film in step (b) of the X-ray mask, the method which is generally used comprises the steps of applying a polishing liquid containing powdered diamond particles having an average particle size of about 3 $\mu$m dispersed in a solvent comprising a mineral oil such as a light oil or a white kerosene at a ratio within the range of 0.1 to 3 wt. % to a thin diamond film;

applying pressure to the surface of the thin diamond film to bring the same into contact with the surface of a soft stool made of copper or tin;

spraying the polishing liquid onto an exposed portion of the soft stool; and polishing the stool and/or the thin diamond film while maintaining the powdered diamond particles in a state in which the particles stick to the surface of the stool which contacts the thin diamond film, the polishing occurring by a repeated mutual plane displacement action such as a mutual horizontal rotation.

Recent advances in the field of semiconductor devices are leading increasingly to higher degrees of integration of the devices, and along with this tendency, X-rays which pass through a thin diamond film which composes the membrane of the X-ray mask are required to be free from a shift which would result in a positional shift of an integrated circuit which receives the radiation of this shift. The X-ray shift is largely affected by the smoothness of the polished surface of the thin diamond film. A lower smoothness leads to a larger X-ray shift. Consequently, the thin diamond films must have increasing greater smoothness. With the conventional polishing method as described above, however, the achievable smoothness of a polished surface of the thin diamond film is an Rms (mean square surface roughness) of about 30 nm at most. Polished surfaces having a surface roughness of this order cannot sufficiently cope with the more extensive integration of semiconductor integrated circuits.

In view of these considerations, studies have now been conducted with a view to achieving a further improvement in smoothness of the polished surfaces of thin diamond films, and the following findings have been made. It is possible to achieve further smoothing of the polished surfaces of thin diamond films, as typically represented by an Rms surface roughness within a range of from 0.5 to 10 nm, in contrast to an Rms of only 30 nm in the conventional polishing method, by using, as a polishing liquid, an aqueous solution in which silicon-dioxide (hereinafter referred to as "$SiO_2$") powder particles having an average particle size of from 5 to 1,000 nm are dispersed and distributed in the aqueous solution in an amount of from 5 to 40 wt. %, the aqueous solution having a coefficient of viscosity of from 1 to 200 cP and a pH of from 8 to 12.5; pressing the surface of the thin diamond film and bringing the same into contact with the flat surface of a stool made of an artificial leather such as soft foamed polyurethane, a fabric such as a non-woven felt fabric, artificial or natural soft organic material such as rubber, a synthetic resin or wood, or preferably, soft foamed polyurethane or non-woven felt fabric; and polishing the surface of the thin diamond film by repetitive mutual plane displacement of the stool and/or the thin diamond film.

SUMMARY OF THE INVENTION

Accordingly, one object of the present invention is to provide a method of polishing the surface of a vapor-phase deposited, synthetic thin diamond film to a greater degree of surface smoothness.

Briefly, this object and other objects of the present invention as hereinafter will become more readily apparent can be attained by a method of polishing the surface of a vapor-phase deposited, synthetic thin diamond film, comprising the steps of:

preparing a polishing liquid of silicon dioxide powder particles having an average particle size within the range of from 5 to 1,000 nm dispersed and distributed in an aqueous solution in an amount of from 5 to 40 wt. %, said dispersion having a coefficient of viscosity of from 1 to 200 cP and a pH of from 8 to 12.5, applying the polishing liquid to a surface of a vapor-phase synthetic thin diamond film and bringing a flat surface of a stool composed of a soft artificial or natural organic material into contact with the surface; and repetitively applying a mutual planar movement under pressure between the surface of the stool and the surface of the thin diamond film.

DETAILED DESCRIPTION OF THE PREFERRED EMBODIMENTS

The reasons for limiting the average particle size of the $SiO_2$ particles and the amount of the particles in the dispersion of the polishing liquid, and the coefficient of viscosity and pH of the polishing liquid in the method of the present invention are as now described.

(a) Average Particle Size of $SiO_2$ Powder

A finer particle size of $SiO_2$ powder leads to the preparation of a polished surface of a higher smoothness. An average particle size of under 5 nm causes a sudden decrease in polishing efficiency, thereby requiring a longer period of time to prepare a prescribed polished surface. At an average particle size of over 1,000 nm, on the other hand, it becomes difficult to prepare a polished surface having a surface roughness better than Rms: 10 nm. The average particle size of $SiO_2$ powder should, therefore, be within the range of from 5 to 1,000 nm, preferably from 10 to 100 nm.

(b) Dispersion Ratio of $SiO_2$ Powder

At a $SiO_2$ particle amount of less than 5 wt. %, the dispersion concentration of $SiO_2$ in the aqueous dispersion is lower, thereby requiring a longer period of time to prepare the desired surface polish. This is not, therefore, practicable. At an amount of over 40 wt. %, on the other hand, aggregation occurs between powder particles, and thie presence of aggregated $SiO_2$ powder particles impairs smoothness. The ratio should, therefore, be within a range of from 5 to 40 wt. %, preferably from 10 to 20 wt. %.

As to the $SiO_2$ powder, preferred are fumed silica and colloidal silica usually manufactured by the vapor-phase synthesis method or the liquid-phase synthesis method. In this case, the surfaces of $SiO_2$ powder particles may be fully oxide surfaces on the atomic level, or the surfaces may be terminated with hydrogen or fluorine may be substituted for oxygen on the surface.

(c) Viscosity of Polishing Liquid

The viscosity of the polishing liquid has an effect on the polishing efficiency. That is, a polishing dispersion of too low a viscosity can be adjusted by the addition of ethylene glycol and a dispersion of too high a viscosity by the addition of ethylene glycol and glycerin for example. A coefficient of viscosity of under 1 cP results in a sudden decrease in polishing efficiency, and a coefficient of viscosity of over 200 cP leads to a long residence time of $SiO_2$ powder on the polished surface, thus acting to inhibit smoothing of the surface. The coefficient of viscosity should, therefore, be within a range of from 1 to 200 cP, preferably from 10 to 30 cP.

(d) pH of Polishing Liquid

While dispersibility of $SiO_2$ powder particles in the polishing liquids varies with the pH value of the dispersion, a pH value of under 8 or of over 12.5 leads to a decrease in dispersibility of the $SiO_2$ particles. If a polishing liquid having such a decreased dispersibility is employed, it is impossible to form a polished surface having excellent smoothness. In order to ensure uniform dispersion of $SiO_2$ particles, it is necessary to adjust the pH value of the polishing liquid, usually with KOH, and further, with $NH_4OH$, NaOH or other alkaline substance within the range of from 8 to 12.5, preferably from 9.5 to 11.

Having now generally described the invention, a further understanding can be obtained by reference to certain specific Examples which are provided herein for purpose of illustration only and are not intended to be limiting unless otherwise specified.

First, a thin diamond film having a thickness of 3.5 μm was formed, by the microwave method, which is a known vapor-phase synthesizing method, on the upper surface of each of ten Si wafers (substrates) each having a radius of 75 mm and a thickness of 1 mm. These thin diamond films had a surface roughness of a Rms value within the range of from 78 to 85 nm.

KOH was mixed into an extra-pure water, and its pH was adjusted. $SiO_2$ powder particles having the average particle sizes shown in Table 1 were dispersed and distributed at the various ratios shown also in Table 1. Viscosities too low were adjusted with ethylene glycol, and viscosities too high were adjusted with ethylene glycol and glycerin, to prepare polishing liquids having a necessary coefficient of viscosity and pH as shown in Table 1.

Then, a stool having a flat surface diameter of 300 mm and a thickness of 10 mm and having the surface lined with a polishing pad made of an artificial leather or soft foamed polyethylene was immersed horizontally in the above-mentioned polishing liquid and held in it. Each of the above-mentioned thin diamond films on Si wafers was placed, with the surface in contact with the polishing pad on the upper surface of the stool immersed in the polishing liquid, and a pressure was applied onto the Si wafer via a holder by means of a hydraulic cylinder. In this state, Examples 1 to 13 of the invention were conducted by polishing the surface of the thin diamond film by mutually rotating the stool and/or the Si wafer under the polishing conditions shown in Table 1. The surface roughness (Rms) of the polished surfaces were measured. The result of this measurement is also shown in Table 1.

For comparative purposes, diamond powder particles having the average particle sizes shown in Table 2 were dispersed and distributed in a white kerosene at ratios also shown in Table 2, thereby preparing polishing liquids.

Then, each surface of the thus prepared thin diamond films on Si wafers was placed in contact with the upper surface of a copper stool. A pressure was applied via a holder onto the Si wafer with a hydraulic cylinder, and the conventional methods 1 to 3 were conducted by polishing the thin diamond film surface by mutually rotating the stool and/or the Si wafer under the polishing conditions shown in Table 2 while spraying the polishing liquid onto the stool. The surface roughnesses (Rms) of the polished surfaces were measured. The results of these measurements are shown in Table 2.

TABLE 1

| Kind | | Polishing liquid | | | | Polishing conditions | | | | Surface roughness |
| --- | --- | --- | --- | --- | --- | --- | --- | --- | --- | --- |
| | | SiO₂ | | | | | | | | |
| | | Average particle size (nm) | Dispersion ratio (wt. %) | Coefficient of Viscosity (cP) | pH | Revolutions of stool (rpm) | Revolutions of thin diamond film (rpm) | Pressure applied to polished surface (g/cm²) | Polishing time (hr) | after polishing of thin diamond film (nm) |
| Present invention | 1 | 7 | 15 | 10 | 10.0 | 120 | 90 | 80 | 15 | 2.2 |
| | 2 | 32 | 20 | 30 | 9.5 | 240 | 150 | 120 | 20 | 2.0 |
| | 3 | 985 | 15 | 200 | 10.0 | 240 | — | 120 | 20 | 9.8 |

TABLE 1-continued

| | Polishing liquid SiO₂ | | | | Polishing conditions | | | | Surface roughness |
|---|---|---|---|---|---|---|---|---|---|
| Kind | Average particle size (nm) | Dispersion ratio (wt. %) | Coefficient of Viscosity (cP) | pH | Revolutions of stool (rpm) | Revolutions of thin diamond film (rpm) | Pressure applied to polished surface (g/cm²) | Polishing time (hr) | after polishing of thin diamond film (nm) |
| 4 | 85 | 15 | 110 | 8.5 | 120 | — | 80 | 15 | 7.9 |
| 5 | 45 | 15 | 20 | 9.5 | 180 | 120 | 100 | 12 | 1.6 |
| 6 | 27 | 15 | 20 | 11.0 | 120 | 160 | 120 | 12 | 3.0 |
| 7 | 60 | 5 | 60 | 10.0 | 180 | 150 | 90 | 12 | 9.1 |
| 8 | 30 | 10 | 25 | 10.5 | 240 | 180 | 100 | 12 | 1.5 |
| 9 | 15 | 15 | 15 | 10.5 | 180 | 150 | 90 | 12 | 1.2 |
| 10 | 45 | 8 | 2 | 10.0 | 240 | 200 | 100 | 12 | 9.7 |
| 11 | 45 | 15 | 35 | 12.5 | — | 250 | 90 | 12 | 5.4 |
| 12 | 30 | 40 | 90 | 11.0 | 180 | 150 | 90 | 12 | 9.9 |
| 13 | 28 | 15 | 15 | 10.5 | 180 | 150 | 90 | 12 | 0.8 |

TABLE 2

| | | Diamond powder in polishing liquid | | Polishing conditions | | | | | Surface roughness |
|---|---|---|---|---|---|---|---|---|---|
| Kind | | Average particle size (nm) | Dispersion ratio (wt. %) | Spraying rate of polishing liquid (cc/min) | Revolutions of stool (rpm) | Revolutions of thin diamond film (rpm) | Pressure applied to polished surface (g/cm²) | Polishing time (hr) | after polishing of thin diamond film (nm) |
| Conventional method | 1 | 2 | 2.0 | 8 | 120 | 50 | 100 | 15 | 31 |
| | 2 | 3 | 0.7 | 6 | 80 | 24 | 100 | 15 | 35 |
| | 3 | 5 | 0.2 | 6 | 80 | 24 | 100 | 25 | 43 |

As is clear from the results of Examples 1 to 13 of the present invention shown in Tables 1 and 2, it is possible to form a polished surface having a surface roughness (Rms) within the range of from 0.8 to 9.9 nm. It is evident that these polished surfaces have a smoothness remarkably more excellent than surfaces having Rms values of from 31 to 43 nm, which are, in fact, achieved in the Comparative Examples 1 to 3. According to the present invention, as described above, it is possible to form a polished surface having excellent smoothness on the surface of a thin diamond film. The resultant polished surface, when used as the membrane of an X-ray mask, can considerably reduce the shift of a semiconductor integrated circuit upon X-ray transmission, thus contributing to a greater ability to integrate with semiconductor devices. Further, when applying the thin diamond film as a component such as a hard coating layer of a cutting tool or a wear-resistant tool, window material for a high-energy electromagnetic wave device, an elastic wave element, a cold cathode, and a component of an electronic device such as a high-temperature semiconductor, it is possible to achieve a smooth surface roughness having an Rms value within the range of from 0.5 to 10 nm of the polished surface, resulting in an improvement of performance of these devices, thus providing industrially useful effects.

Japanese priority application serial number 09-314925 having a filing date of Nov. 17, 1997 is hereby incorporated by reference into the present application.

Obviously, numerous modifications and variations of the present invention are possible in light of the above teachings. It is, therefore, to be understood that within the scope of the appended claims, the invention may be practiced otherwise than as specifically described herein.

What is claimed as new and is desired to be secured by Letters Patent is:

1. A diamond film having a surface roughness (Rms) of from 0.5 to 10.0 nm.

2. A method of making a diamond film, the method comprising vapor depositing a diamond film on a substrate;

preparing a silica dispersion including 5 to 40 wt % of silicon dioxide particles having an average particle size of from 5 to 1,000 nm dispersed in an aqueous solution, the silica dispersion having a coefficient of viscosity of from 1 to 200 cP and a pH of from 8 to 12.5, applying the silica dispersion to a surface of the diamond film and bringing a flat surface of a stool comprising an organic material into contact with the surface of the diamond film;

polishing the surface of the diamond film by repetitively moving the surface of the stool parallel to the surface of the diamond film while pressing the surface of the stool and the surface of the diamond film together; and forming the diamond film of claim 1.

3. The method of claim 2, wherein the diamond film is vapor deposited on a semiconductor substrate.

4. The method of claim 2, wherein the silica dispersion includes 10 to 20 wt % of the silicon dioxide particles.

5. The method of claim 2, wherein the silica dispersion has a coefficient of viscosity of 10 to 30 cP.

6. The method of claim 2, wherein the silica dispersion has a pH of 9.5 to 11.

7. The method of claim 2, wherein the pH of the silica dispersion is adjusted with added NaOH, KOH or $NH_4OH$.

8. The diamond film of claim 1, wherein the diamond film is on a semiconductor substrate.

9. The method of claim 2, wherein the average particle size of the silicon dioxide particles is from 10 to 100 nm.

10. The diamond film of claim 1, wherein a thickness of the diamond film is from 1 to 3.5 μm.

11. A method of making a diamond film, the method comprising polishing a diamond film; and forming the diamond film of claim 1.

12. A method of using a diamond film, the method comprising transmitting X-rays through the diamond film of claim 1.

13. A diamond film having a surface roughness (Rms) of from 0.5 to 3.0 nm.

14. The diamond film of claim 13, wherein the diamond film is on a semiconductor substrate.

15. The diamond film of claim 13, wherein a thickness of the diamond film is from 1 to 3.5 µm.

16. A method of making a diamond film, the method comprising polishing a diamond film; and forming the diamond film of claim 13.

17. A method of using a diamond film, the method comprising transmitting X-rays through the diamond film of claim 13.

18. A method of making a diamond film, the method comprising vapor depositing a diamond film on a substrate;

preparing a silica dispersion including 5 to 40 wt % of silicon dioxide particles having an average particle size of from 5 to 1,000 nm dispersed in an aqueous solution, the silica dispersion having a coefficient of viscosity of from 1 to 200 cP and a pH of from 8 to 12.5, applying the silica dispersion to a surface of the diamond film and bringing a flat surface of a stool comprising an organic material into contact with the surface of the diamond film;

polishing the surface of the diamond film by repetitively moving the surface of the stool parallel to the surface of the diamond film while pressing the surface of the stool and the surface of the diamond film together; and forming the diamond film of claim 13.

* * * * *